United States Patent
Kim et al.

(10) Patent No.: US 12,044,005 B2
(45) Date of Patent: Jul. 23, 2024

(54) SMART WALL

(71) Applicant: LG ELECTRONICS INC., Seoul (KR)

(72) Inventors: Yunjoo Kim, Seoul (KR); Yanghwan No, Seoul (KR); Jaemyo Shim, Seoul (KR); Junghan Ryu, Seoul (KR); Junghoon Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/634,638

(22) PCT Filed: Aug. 20, 2019

(86) PCT No.: PCT/KR2019/010524
§ 371 (c)(1),
(2) Date: Feb. 11, 2022

(87) PCT Pub. No.: WO2021/029474
PCT Pub. Date: Feb. 18, 2021

(65) Prior Publication Data
US 2022/0341160 A1    Oct. 27, 2022

(30) Foreign Application Priority Data

Aug. 14, 2019  (KR) ......................... 10-2019-0099236

(51) Int. Cl.
*E04B 2/58*    (2006.01)
*E04B 2/00*    (2006.01)
(Continued)

(52) U.S. Cl.
CPC ................ *E04B 2/58* (2013.01); *E04B 2/74* (2013.01); *E04B 2/7448* (2013.01);
(Continued)

(58) Field of Classification Search
CPC . E04B 2/58; E04B 2/74; E04B 2/7448; E04B 2/7457; E04B 2/76; E04B 2002/7483; E04C 2/46; H05K 7/18
See application file for complete search history.

(56) References Cited

U.S. PATENT DOCUMENTS 5,067,287 A * 11/1991 Lewis ................ G09F 15/0006
434/408
6,230,445 B1 * 5/2001 Arko ..................... E04B 2/7416
52/36.5
(Continued)

FOREIGN PATENT DOCUMENTS

EP        1747328 B1    6/2011
JP     2008-208706 A    9/2008
(Continued)

*Primary Examiner* — Jessie T Fonseca
(74) *Attorney, Agent, or Firm* — Birch, Stewart, Kolasch & Birch, LLP

(57) ABSTRACT

A smart wall comprises: a frame structure including a mounting cell; an electronic product disposed in the mounting cell; and an art wall covering the front of the frame structure, wherein the frame structure comprises: a first steel section; a second steel section which includes a second fastening part formed at the end thereof and is disposed in a direction perpendicular to the first steel section; a first fastening part which includes multiple first fastening holes arranged in the width direction of the first steel section; the second fastening part which is located at the end of the second steel section and includes multiple second fastening holes corresponding to the multiple first fastening holes; and fastening screws passing through the first fastening part and the second fastening part, and the first fastening part comprises multiple first fastening parts disposed at predetermined intervals in the extension direction of the first steel (Continued)

section. Accordingly, various frame structures can be implemented and thus reduced manufacturing costs can be achieved.

12 Claims, 9 Drawing Sheets

(51) Int. Cl.
*E04B 2/74* (2006.01)
*E04B 2/76* (2006.01)
*H05K 7/18* (2006.01)

(52) U.S. Cl.
CPC .............. *E04B 2/7457* (2013.01); *E04B 2/76* (2013.01); *E04C 2/46* (2013.01); *H05K 7/18* (2013.01); *E04B 2002/7483* (2013.01)

(56) References Cited

U.S. PATENT DOCUMENTS

| | | | |
|---|---|---|---|
| 9,273,473 B2* | 3/2016 | Millson | F16M 13/02 |
| 10,435,885 B2* | 10/2019 | Piethman | E04B 1/14 |
| 11,000,126 B1* | 5/2021 | Kim | A47B 97/001 |
| 2004/0255535 A1 | 12/2004 | Herren | |
| 2007/0096606 A1* | 5/2007 | Ryu | F16M 13/02 |
| | | | 312/7.2 |
| 2008/0054144 A1* | 3/2008 | Wohlford | F16M 11/08 |
| | | | 248/231.91 |
| 2008/0230207 A1 | 9/2008 | Nakamura et al. | |
| 2008/0309833 A1* | 12/2008 | Nakamura | E04B 2/7453 |
| | | | 348/794 |
| 2009/0241437 A1* | 10/2009 | Steinle | E04F 19/08 |
| | | | 52/27 |
| 2010/0215205 A1* | 8/2010 | Nagao | H04R 1/26 |
| | | | 381/388 |
| 2011/0304781 A1* | 12/2011 | Rowell | F16M 13/02 |
| | | | 348/841 |
| 2014/0137485 A1* | 5/2014 | Lafferty, III | E04G 23/0218 |
| | | | 52/29 |

FOREIGN PATENT DOCUMENTS

| | | | |
|---|---|---|---|
| JP | 2017-61788 A | | 3/2017 |
| KR | 20-1995-0008782 Y1 | | 10/1995 |
| KR | 10-0973417 B1 | | 7/2010 |
| KR | 10-2018-0042484 A | | 4/2018 |
| KR | 102018004284 | * | 4/2018 |
| KR | 20210100489 A | * | 8/2021 |

* cited by examiner

FIG. 5
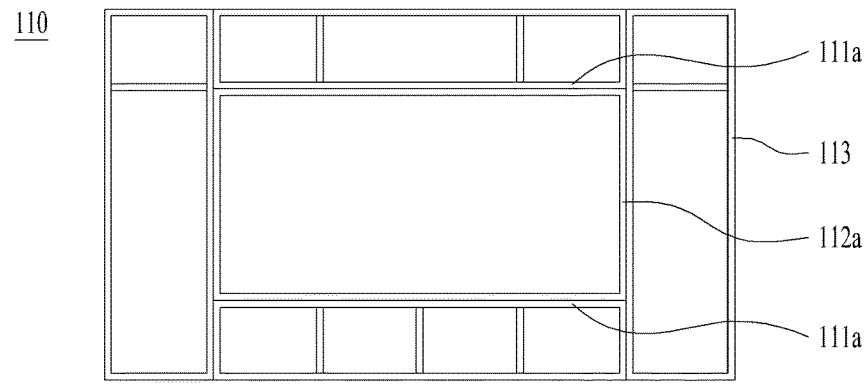
(a)
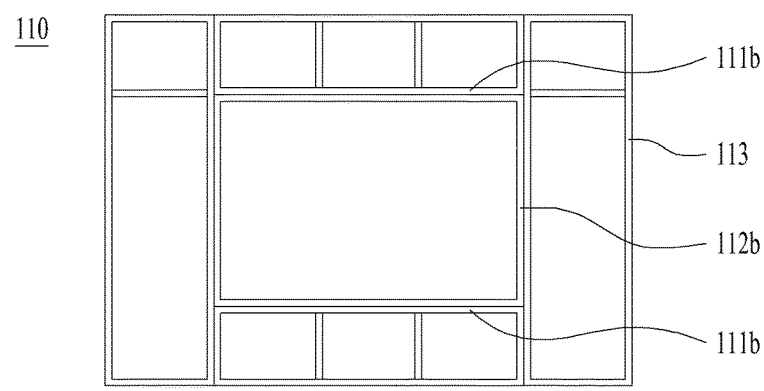
(b)
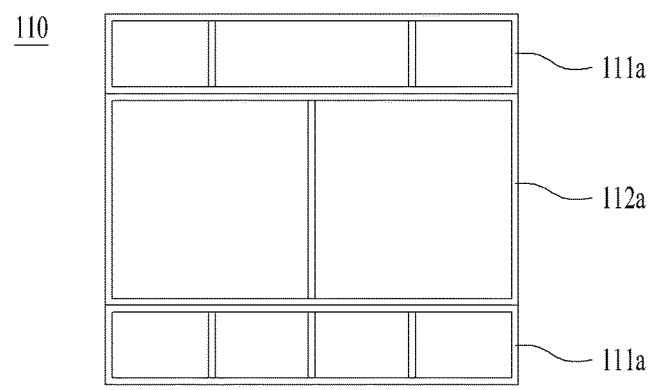
(c)

FIG. 8
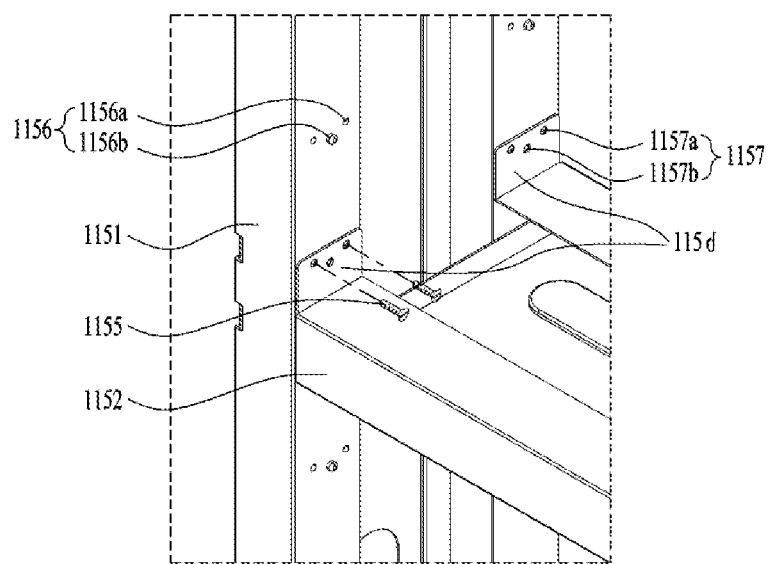
(a)
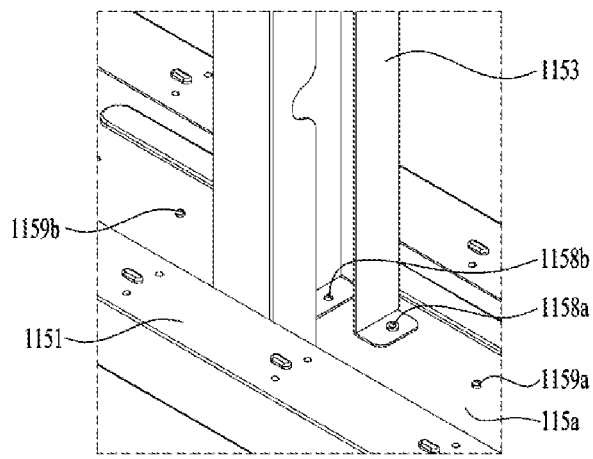
(b)

SMART WALL

CROSS REFERENCE TO RELATED APPLICATIONS

This application is the National Phase of PCT International Application No. PCT/KR2019/010524, filed on Aug. 20, 2019, which claims priority under 35 U.S.C. 119(a) to Patent Application No. 10-2019-0099236, filed in the Republic of Korea on Aug. 14, 2019, all of which are hereby expressly incorporated by reference into the present application.

TECHNICAL FIELD

The present disclosure relates to a smart wall including a frame on which a multimedia device, such as a TV and a speaker, and a home appliance are mounted.

BACKGROUND ART

Recently, as the infrastructure in which all media devices and home appliances at home beyond the smartphone are connected to the Internet is built, the smart home is emerging as a keyword of a new smart ecosystem. In particular, user experiences and values accumulated through smartphones, which are personal media devices, have begun to extend to other devices.

As various attempts such as building a home network system were made in order to make media devices and home appliances to interoperate with each other, the number of electronic devices at home has increased and there is a hassle of connecting the devices one by one.

In particular, it is a recent trend to minimize the number of pieces of furniture and electronics that are placed near the living room wall, around which the TV is usually placed, to keep a neat appearance of the living room wall, which represents the house. In addition, where there are children in a house, they may be pushed over or bumped and injured due to a TV table or a loudspeaker placed in the living room. Therefore, it is important to reduce the number of pieces of furniture and electronics protruding into the space of the living room.

DISCLOSURE

Technical Problem

The present disclosure is to provide a smart wall that may easily fasten and deform a frame on which a multimedia device, such as a TV and a speaker, and a home appliance are mounted.

Technical Solutions

Provided is a smart wall including a frame structure having a mounting cell defined therein, an electronic appliance disposed in the mounting cell, and an art wall for covering a front surface of the frame structure, wherein the frame structure includes a first shape steel, a second shape steel including a second fastening portion formed at an end thereof and disposed in a direction perpendicular to the first shape steel, a first fastening portion including a plurality of first fastening holes defined in a width direction of the first shape steel, the second fastening portion positioned at the end of the second shape steel and including a plurality of second fastening holes respectively corresponding to the plurality of first fastening holes, and a fastening screw passing through the first fastening portion and the second fastening portion, wherein the first fastening portion includes a plurality of first fastening portions spaced apart from each other by a predetermined distance in an extending direction of the first shape steel.

The plurality of first fastening portions may be symmetrical with respect to a center in a longitudinal direction of the first shape steel.

The first fastening portion may include a first guide, and the second fastening portion may include a second guide fastened to the first guide.

The first guide may be disposed between the plurality of first fastening holes defined in the width direction, and the second guide may be disposed between the plurality of second fastening holes defined in the width direction.

Each of the first shape steel and the second shape steel may include a base, a pair of side walls extending in a direction perpendicular to the base at both ends in the width direction of the base, and a pair of edges respectively extending in a direction parallel to the base from respective ends of the pair of side walls.

The second shape steel may further include a wing portion bent in a direction perpendicular to the edge at an end in a longitudinal direction of the edge, and the second fastening portion may be formed in the wing portion.

The first fastening portion may be formed at the edge of the first shape steel.

The smart wall may further include an outlet inserted into a portion between respective ends of the pair of edges.

The shape steel may include a plurality of vent holes defined therein.

A length of the first shape steel may be greater than a length of the second shape steel.

The frame structure may include a frame module including a pair of first shape steels, and a pair of second shape steels respectively disposed at ends in a longitudinal direction of each of the pair of first shape steels.

The frame module may include a first frame module having the first shape steel disposed in a horizontal direction, and the first frame module may be disposed between the pair of second shape steels and further include a third shape steel having a width smaller than a width of the second shape steel.

Each of the first shape steel and the second shape steel may include a base, a pair of side walls extending in a direction perpendicular to the base at both ends in the width direction of the base, and a pair of edges respectively extending in a direction parallel to the base from respective ends of the pair of side walls, and the third shape steel may be inserted into a portion between the pair of edges of the first shape steel.

The frame module may further include a second frame module having a length the same as the first shape steel of the first frame module and greater than a length of the second shape steel of the first frame module, and the first frame module and the second frame module may be stacked in a vertical direction.

The frame module may include a third frame module having the first shape steel vertically disposed, and the second shape steel may include a plurality of second shape steels arranged side by side in the longitudinal direction of the first shape steel.

Advantageous Effects

A smart wall according to the present disclosure may be installed on a wall at the same height as a multimedia device such as a TV or an audio device mounted thereon, and may therefore provide a tidy appearance.

Without a need for manufacturing various types of shape steels, fastening portions of a first shape steel and a second shape steel may be standardized and various frame structures may be implemented through length adjustment and fastening position varying, thereby reducing a manufacturing cost.

A size of a smart wall may vary depending on an installation location, so that the smart wall is customizable. In particular, it is easy to adjust a position of each shape steel of a frame module, so that a size of a mounting cell may be adjusted based on a shape of an electronic part.

The smart wall may be modularized, thereby facilitating mounting of any appliance. When a repair is needed, only a module may be easily removed. Thus, installation and maintenance are simple. Additionally, when a multimedia device or an appliance is added, the smart wall may be easily extended by adding a unit.

Further, it is not necessary to move away unused seasonal appliances into a separate mounting cell, which is advantageous in terms of securing space.

Further scope of applicability of the present disclosure will become apparent from the detailed description below. Various changes and modifications within the spirit and scope of the present disclosure may be clearly understood by those skilled in the art, and therefore, the detailed description and specific embodiments, such as preferred embodiments of the present disclosure, should be understood as given by way of example only.

DESCRIPTION OF DRAWINGS

FIG. 5 is a view illustrating a frame module of the smart wall according to an embodiment of the present disclosure.

FIG. 8 is a view showing portions B and C of FIG. 6.

BEST MODE

Hereinafter, exemplary embodiments disclosed herein will be described in detail with reference to the accompanying drawings. The same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In the following description of the embodiments of the present disclosure, a detailed description of known technology will be omitted to avoid obscuring the subject matter of the present disclosure. The accompanying drawings are intended to facilitate understanding of the embodiments disclosed herein, and should not be construed as limiting the technical idea disclosed in the present specification. The disclosure is to cover all modifications, equivalents, and alternatives falling within the spirit and scope of the embodiments.

Terms including ordinal numbers such as first, second, etc. may be used to explain various elements. However, it will be appreciated that the elements are not limited to such terms. These terms are merely used to distinguish one element from another.

Stating that one constituent is "connected" or "linked" to another should be understood as meaning that the one constituent may be directly connected or linked to another constituent or another constituent may be interposed between the constituents. On the other hand, stating that one constituent is "directly connected" or "directly linked" to another should be understood as meaning that no other constituent is interposed between the constituents.

As used herein, the singular forms "a", "an", and "the" include plural referents unless context clearly dictates otherwise.

In this specification, terms such as "includes" or "has" are intended to indicate existence of characteristics, figures, steps, operations, constituents, components, or combinations thereof disclosed in the specification. The terms "includes" or "has" should be understood as not precluding possibility of existence or addition of one or more other characteristics, figures, steps, operations, constituents, components, or combinations thereof.

Figure 1:
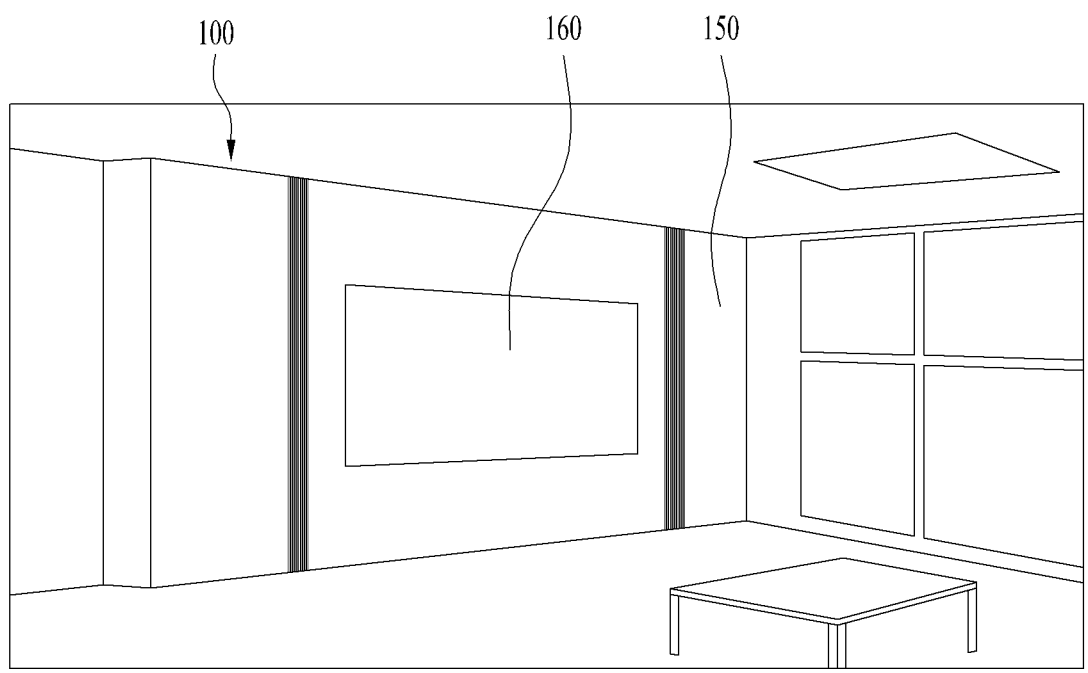
FIG. 1 is a view illustrating an installation example of a smart wall of the present disclosure.

FIG. 1 is a view showing a wall-type frame of a smart wall 100 of the present disclosure. The present disclosure relates to a smart wall 100 systemized by integrating electronic devices used at home, such as media devices and home appliances, with a wall so as not to be exposed through the exterior of the smart wall. The present disclosure provides a total space solution that minimizes the exposure of electronic devices in a space by mounting various electronic devices such as a display, an interphone, a loudspeaker, an air purifier, a humidifier, a light, a digital clock, a router, and a set-top box on a wall.

Recently, the thickness of a display device 161 has become thin. Thus, the smart wall 100 of the present disclosure may be formed to have a thickness of 15 to 20 cm, thereby preventing the interior space from being narrowed during installation. Rather, the storage furniture and a home appliance 160 may be embedded in the smart wall 100 to provide a neat appearance. When necessary, a part of the wall may be selectively drawn out to allow a necessary home appliance to protrude from the wall, and the space where the home appliances are not embedded may be used as a mounting cell 114 for an item such as a drawer.

Recently, it has become possible to design a thin TV, and thus a thin display is implementable. Accordingly, the TV itself may serve as a cover of a frame and may be coupled to the frame to define a front appearance. An opening 153 may be formed in an art wall 151 to expose the display of the display device 161. A cover to open and close the opening 153 may be further provided.

A display employing organic light-emitting diodes (OLED) is bendable, and therefore it may be exposed to the outside only when used and may be rolled up and kept inside the wall when not in use, thereby providing a tidy screen by appearance.

Regarding projectors, a unifocal projector has recently been developed. This projector may be mounted on the wall and drawn out like a drawer to output images on a screen, thereby implementing a large screen. In this case, when the projector is in use, the display is unseeable from the outside of the smart wall 100, and therefore may provide a tidier appearance.

Figure 2:
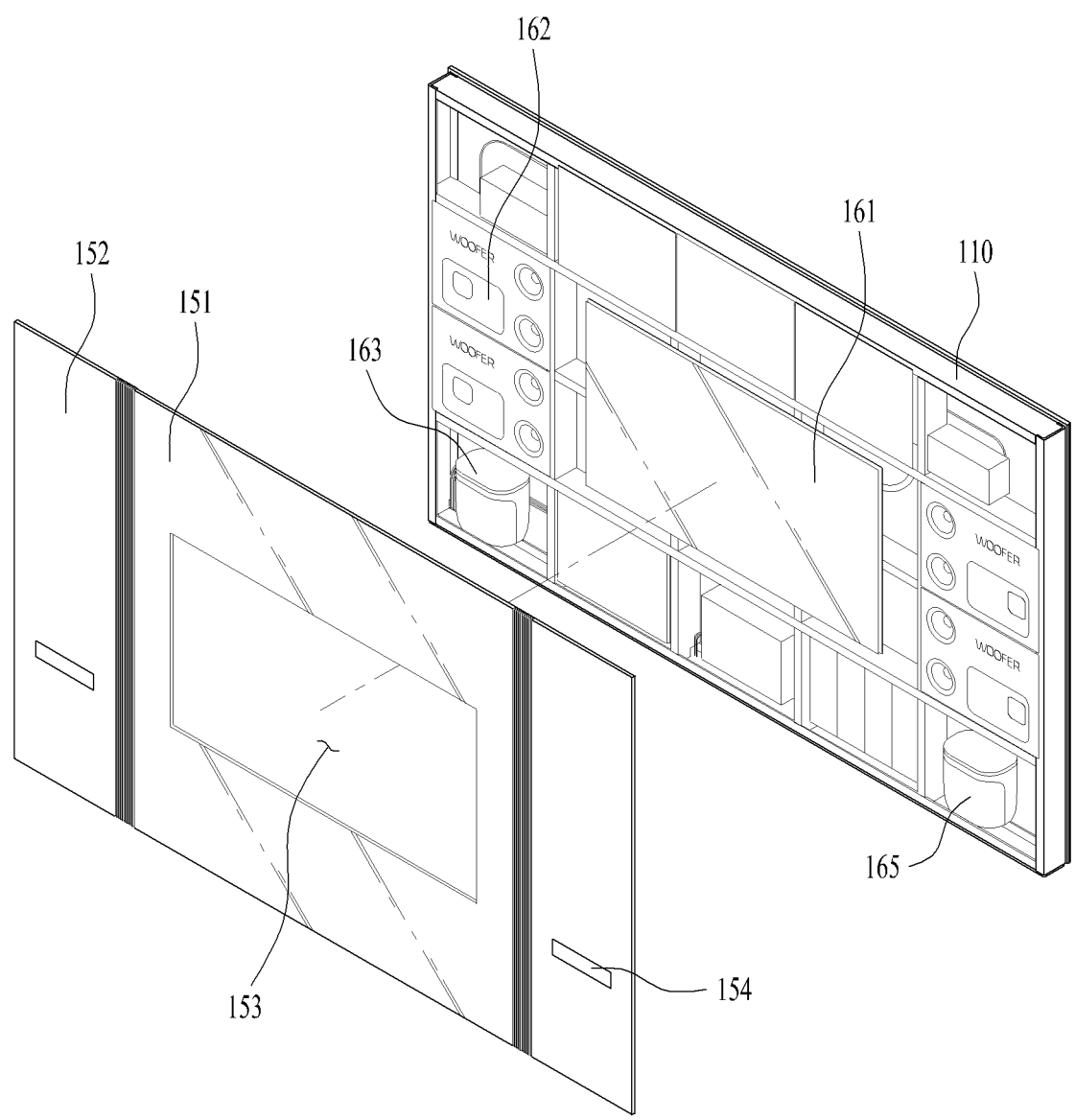
FIG. 2 is an exploded perspective view of the smart wall according to an embodiment of the present disclosure.

FIG. 2 is an exploded view of the smart wall 100 of the present disclosure. A frame structure formed by a plurality of pieces of shape steel arranged in a grid form may be disposed inside the art wall 150, which is the front. The frame structure 110 is a rigid member. The frame structure 110 may support the wall so as not to collapse even when an impact is applied to the wall. A panel may be attached to the front of the frame structure 110 to hide the electronic appliance 160 mounted on the frame structure 110, thereby looking like a wall. The front wall covered with such a panel is called an art wall 150.

The art wall 150 may be changed according to the preference of the consumer. The art wall 150 may be easily changed after being installed to change the mood of the home.

The shape steel 115 arranged in a grid form may partition the mounting cell 114, and seat the electronic appliance 160 in each of the partitioned mounting cells 114. The partitioned mounting cells 114 may have the same size or sizes which are multiples of a size. Thus, the electronic appliance 160 to be mounted may be modularized and disposed at any position in the frame structure 110.

In addition to the display device 161 described above, a sound device 152 such as a loudspeaker 162 may be mounted in the mounting cell 114. Multiple sound devices 152 may be configured according to the number of channels. The art wall 152 covering the sound device may be configured in a mesh form to allow sound to be output, or may selectively open and close the openings through which the sound is output, such that the openings exposed to the outside are minimized. To prevent infiltration of water, the openings may be formed using a waterproof mesh or the like.

A dehumidifier 163, a humidifier 165, an air conditioner, a stove, and the like, which are seasonal household appliances, may be provided. Leaving the seasonal appliances exposed to the outside when not in use may cause dust to accumulate on the appliances and undermine the appearance. Thus, the seasonal appliances are usually kept in a storage area with a cover put thereon when they are not in use. When such appliances are embedded in the smart wall 100 in the present disclosure, they may be covered with the art wall 150 so as not to be exposed to the outside when they are not used, and therefore the need for the separate mounting cell 114 may be eliminated.

The dehumidifier 163 or the humidifier 165 may implement a drawer type space for collecting/storing water to remove collected water or supply water. Openings 154 through which air passes are needed to discharge water or to collect moisture in the surroundings. An air cleaner may be installed at a lower end of the smart wall 100 to allow a user to easily open the air cleaner to periodically replace the filter with a new one.

The openings 154 may not be necessarily formed in the art wall 150, but a gap between the art wall 150 and the frame structure 110 may be used.

In addition, when a set-top box or a Wi-Fi router is provided, a home network system may be implemented. a not only functional units mounted on the smart wall 100 but also other electronic devices such as a computer or a mobile terminal located outside the smart wall 100 may be connected via the Wi-Fi router and controlled in an interworking manner.

An LED or a small display panel may be arranged on an upper portion of the smart wall to provide a user with simple information such as weather, time, event information, or may be used as lighting. A light may be provided to the smart wall 100 to obtain an interior effect.

When different communication schemes or signals are used between the devices, the router serves as an intermediate device to coordinate the schemes or signals and guide a path. In addition, a functional unit mounted on the smart wall 100 may be connected and controlled via a WIFI router, rather than being connected by wire.

The router also serves to connect an external network and the internal network to each other. Accordingly, the user staying outside may control the router connected to the external network to control not only the functional units mounted on the smart wall 100 but also as home appliances and media devices connected to the internal network.

In addition, the electronic devices of the smart wall 100 may be controlled in operative connection with a mobile device. That is, when the mobile device is mounted on the smart wall 100, media images and music on the mobile device may be output. In addition, when a video call is received through the mobile device, the image of the other party may be provided through the display of the smart wall 100.

In addition, a wall pad connected to a camera or security system of the front door may be provided in the mounting cell 114 of the smart wall 100. The wall pad embedded in the existing bearing wall is difficult to repair and replace in case of failure, and there is a difficulty in changing the location thereof. However, when the wall pad is configured in a unit form and provided in the smart wall 100, maintenance thereof is easy.

The smart wall 100 may be installed in a room as well as the living room. The wall between the rooms may be configured as the smart wall 100 to use the smart wall 100 in both directions in neighboring rooms. For example, one air conditioner or air purifier may be used in both spaces when it is arranged to be reachable in both directions. Instead of the TV and loudspeaker 162 used in the living room, a monitor and a personal computer (PC) may be mounted and used based on the purpose of the room. Alternatively, another functional unit such as an electronic board may be mounted and used according to the age of a child.

When installed in an office, a smart wall 100 equipped with functional units such as an electronic board, an air purifier, a video conference system, and a PC may be used. The electronic appliance 160 mounted on the smart wall 100 is covered by the art wall 150 and thus do not require a separate exterior case.

When the smart wall 100 is installed after being manufactured at a factory according to a user's installation location, large quantities of the same module may be manufactured and supplied to a hotel/resort or apartment under construction, thereby reducing defect rate and manufacturing costs.

However, it is difficult to transport the smart wall 100 that has been assembled. Further, when construction of a building is completed, it is difficult to bring the smart wall 100 into the building. Accordingly, when the smart wall 100 is installed at the time of movement into an existing building or remodeling of the interior, the smart wall 100 may be implemented by installing a frame in the building and inserting a unit module. In this case, for ease of installation and standardization, the frame structure 110 may be implemented using a plurality of module frames.

Figure 3:
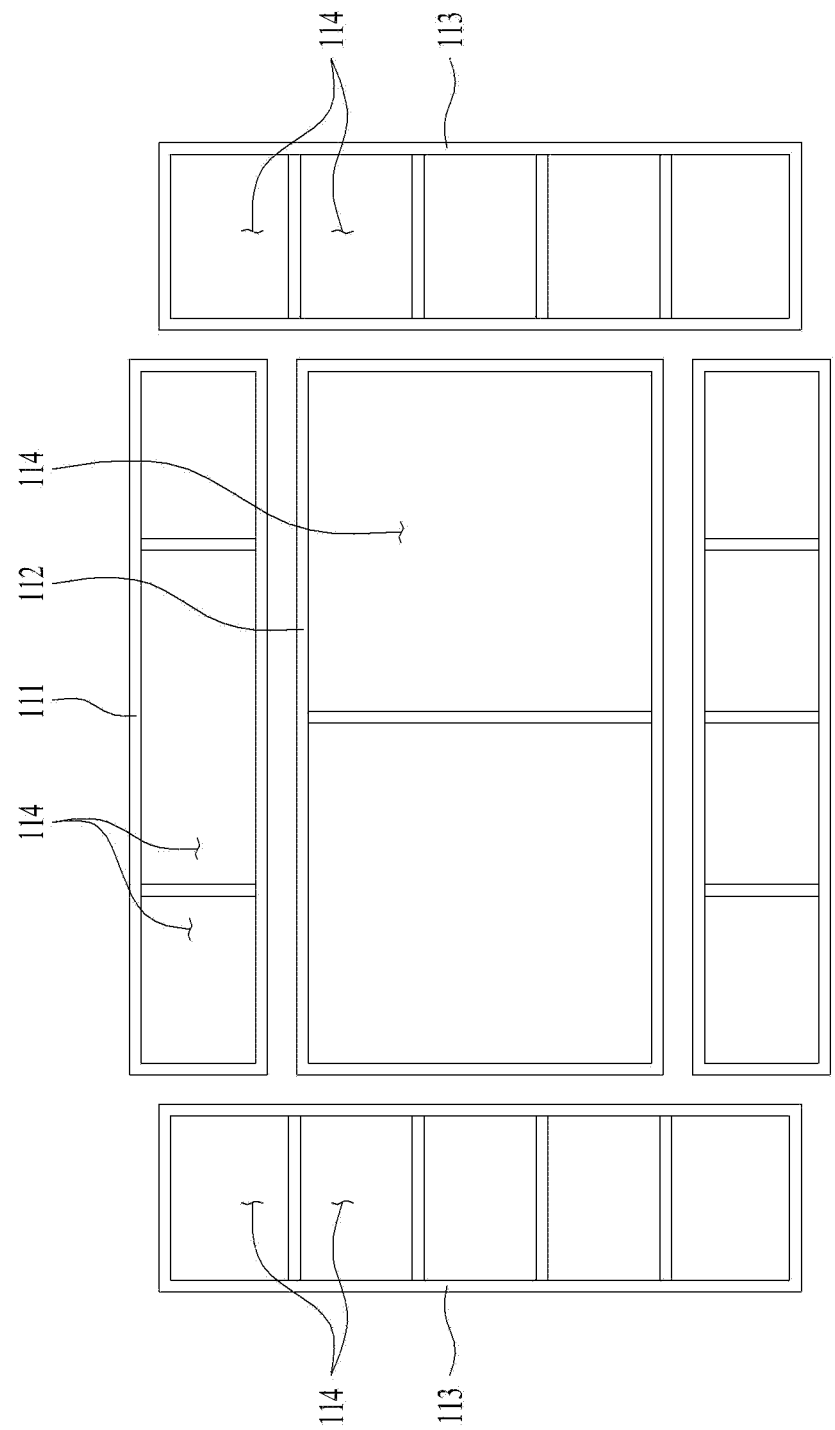
FIG. 3 is a view illustrating a configuration of frames of the smart wall according to an embodiment of the present disclosure.

FIG. 3 is a view illustrating coupling of frame modules 111, 112, and 113 of the smart wall 100 according to an embodiment of the present disclosure. In order to mount each component, bookcase-type frame modules 111, 112, and 113 including the mounting cell 114 may be used. In order to partition the mounting cell 114, the frame modules 111, 112, and 113 may be manufactured by arranging a plurality of beam-shaped members in a grid form.

The frame modules 111, 112, and 113 may include a first frame module 111 having mounting cells 114 arranged side by side in a horizontal direction, a second frame module 112 provided to mount a large appliance 160 such as the display device 161, a third frame module 113 having mounting cells 114 arranged side by side in a vertical direction.

Figure 4:
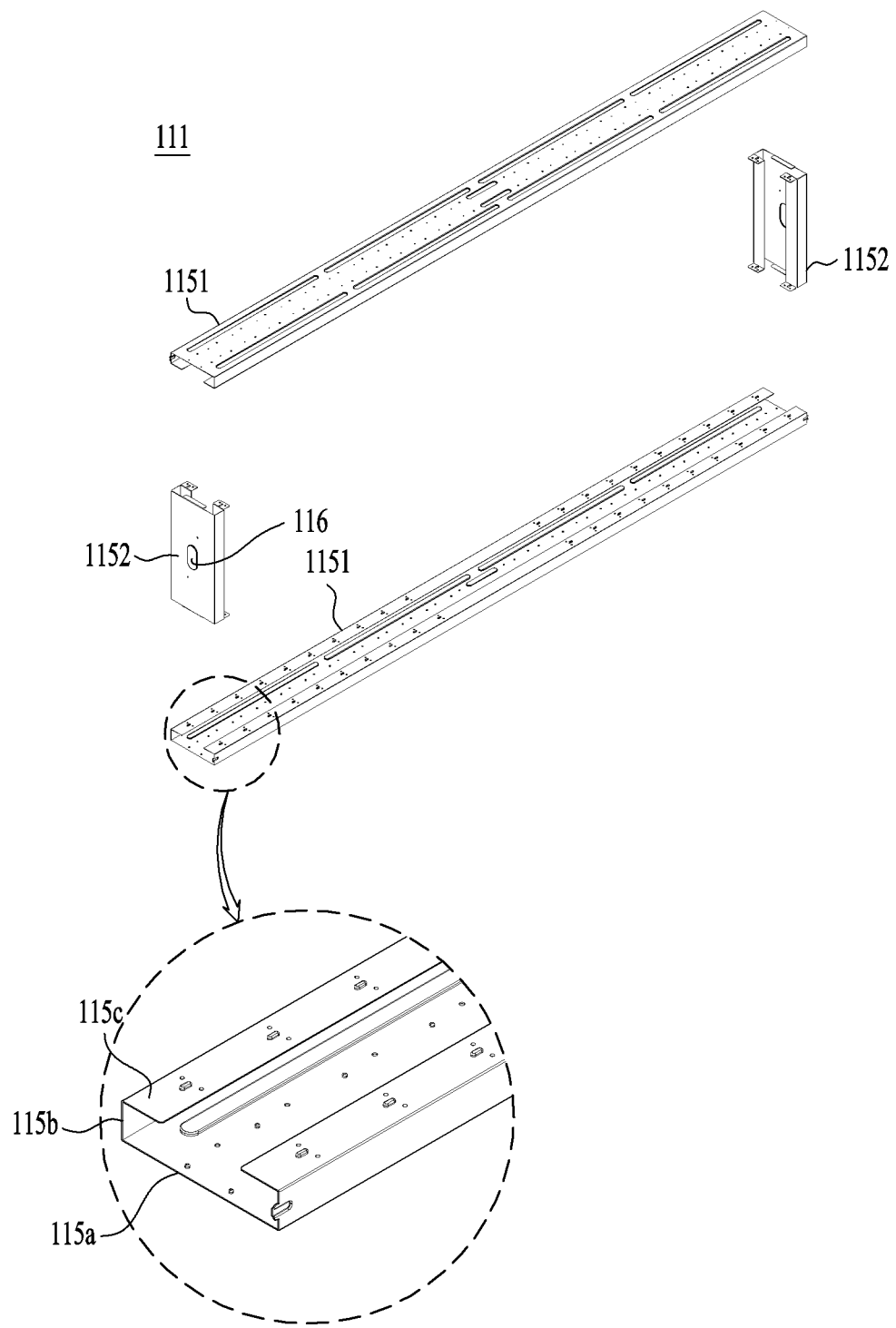
FIG. 4 shows examples of various frame structures according to a combination of frame modules of the present disclosure.

The second frame module 112 includes a large space to allow the display device 161 of any size to be mounted therein. When necessary, as shown in FIG. 4, beams to partition the mounting cell 114 may be provided to fix the display device 161 and to enhance rigidity of the frame structure 110.

The first frame module 111 and the second frame module 112 may be stacked in a vertical direction. The horizontal length of the first frame module 111 may be the same as the horizontal length of the second frame module 112. Thus, when the modules are stacked in the vertical direction, they may be disposed so as not to be misaligned.

The first frame module 111 may be disposed both over and under the second frame module 112. The number of first frame modules 111 stacked in the vertical direction may be increased or decreased depending on the sizes of the first frame module 111 and the second frame module 112 or the size of the installation space.

The third frame module 113, in which the mounting cells 114 are arranged side by side in the vertical direction, may have the same height as that of the first frame module 111 and the second frame module 112 stacked in the vertical direction. As shown in FIG. 4, the third frame module 113 may be located on the lateral sides of the first frame module 111 and the second frame module 112. The frame modules 111, 112, and 113 may be coupled with fasteners to form the frame structure 110 having a rectangular parallelepiped shape.

FIG. 4 is a view showing a method for manufacturing the frame modules 111, 112, and 113 of the present disclosure, and illustrates the first frame module 111 in which the mounting cell is directed in a horizontal direction as an example. Each of the frame modules 111, 112, and 113 may generally use an elongated shape steel 115. Each of the frame modules 111, 112, and 113 may be manufactured by coupling the shape steels 115 elongated in one direction. The shape steel collectively refers to beam-shaped members with various cross-sectional shapes as structural members. It is possible to compose a column-shaped shape steel having the same cross-section in a longitudinal direction by rolling or bending a plate. The shape steel has an advantage of obtaining rigidity of a magnitude equal to or greater than a certain magnitude with light and less material because the shape steel has an empty space compared to a beam-shaped member with a filled circular or rectangular cross-section.

The present disclosure may use a C shaped steel 115 having a C-shaped cross-section as shown in FIG. 4. The C shaped steel 115 may be formed by vertically bending both ends in a width direction of a metal plate. Each component of the shape steel 115 will be described in detail. The shape steel 115 may include a base 115a, a pair of side walls 115b extending in a direction perpendicular to the base 115a respectively from the both ends in the width direction of the base 115a, and a pair of edges 115c respectively extending in a direction parallel to the base 115a from respective ends of the pair of sidewalls 115b.

When the both ends are vertically bent only once, a ⊏-shaped cross-section may be obtained. In addition, when the both ends are vertically bent twice, a C-shaped cross-section may be obtained. In a space surrounded by the base 115a, the side walls 115b, and the edges 115c, a power or signal line connected to the electronic appliance 160 may be disposed, or an outlet module to which power or data cables are fastened may be disposed.

The outlet module may include a power terminal for supplying power, a data terminal for data transmission and reception such as an Internet line or a cable input, and a connector by which a functional unit inserted into the frame is connected to another functional unit. The connector has terminals on both sides of the frame. When data connection lines of electronic devices are inserted into the terminals, the devices may exchange data with each other. The outlet module may include a rail structure that moves along the frame modules 111, 112, and 113.

A vent hole 116 may be formed in the shape steel 115 as shown in FIG. 4. The vent hole 116 may reduce the weight of the shape steel 115 and discharge heat generated from the electronic appliance 160. A fan may also be used to discharge hot air to the outside to more actively discharge heat. When the heat of the electronic appliance 160 is discharged into an indoor space, a heating effect may be obtained in winter. However, in summer, discharging the heat into the indoor space may cause the indoor temperature to rise. Thus, the fan may be used to internally circulate heat, or a structure to discharge heat to the outside may be added to the wiring connected to the outdoor unit of the air conditioner.

Each of the frame modules 111, 112, and 113 may include a first shape steel 1151 extending in a first direction and a second shape steel 1152 vertically coupled thereto. The second shape steel 1152 may be placed between a pair of first shape steels 1151. At least two second shape steels 1152 may be included at both ends of the first shape steel 1151, and the second shape steel 1152 may be further added in a middle of the first shape steel 1151 when necessary. For the first frame module 111 and the third frame module 113, the first shape steel 1151 may be placed in a horizontal direction and the second frame module 112 may be placed longitudinally with the first shape steel 1151.

The inner steel positioned inside the outer steel may define the mounting cell 114 by partitioning a space surrounded by the outer steel. The inner steel may be immovably connected to the outer steel by welding, and part of the inner steel may be bolted or hooked so as to be removed when necessary.

Thus, by fascinating the frame modules 111, 112, and 113 in the form of a semi-finished appliance 160 in the above-described manner, the number of connection operations to be performed on the site may be reduced. The dimensions of the appliance 160 may be kept constant and the installation time may be reduced. In addition, the product may be modularized into a size that facilitates movement of the product, and therefore may be easily moved to the site.

FIG. 5 shows examples of various frame structures 110 according to a combination of the frame modules 111, 112, 113 of the present disclosure. FIG. 5(a) illustrates assembly of a frame structure 110 consisting of a pair of first frame modules 111a, one second frame module 112a, and a pair of third frame modules 113. Since the first frame module 111a has four mounting cells 114, the width of the first frame module 111a may not fit to a narrow indoor space for installation.

Accordingly, as shown in FIG. 5(b), a first frame module 111b having three mounting cells 114 to have a short horizontal length may be used. The second frame module 112b may have a length corresponding to the horizontal length of the first frame module 111b.

In addition, the third frame modules 113 may be disposed on both sides of the vertical stack of the first frame module 111 and the second frame module 112. The height of a typical house is 220 cm to 230 cm, the third frame module 113 may be configured to have a height a little less than 220 cm. While a five-stage vertical frame is illustrated in the drawings, a six-stage vertical frame may be manufactured in case of a multilayer house or a house having a great floor height.

When installed in a narrower space, the frame structure 110 may be configured using only the first frame module 111a and the second frame module 112a without the third frame module 113. When a large display device 161 is not mounted, only the third frame modules may be arranged in a line to implement the frame structure 110. Each frame module 111, 112, 113 may be fastened by bolts, or may be fastened by welding.

Figure 6:
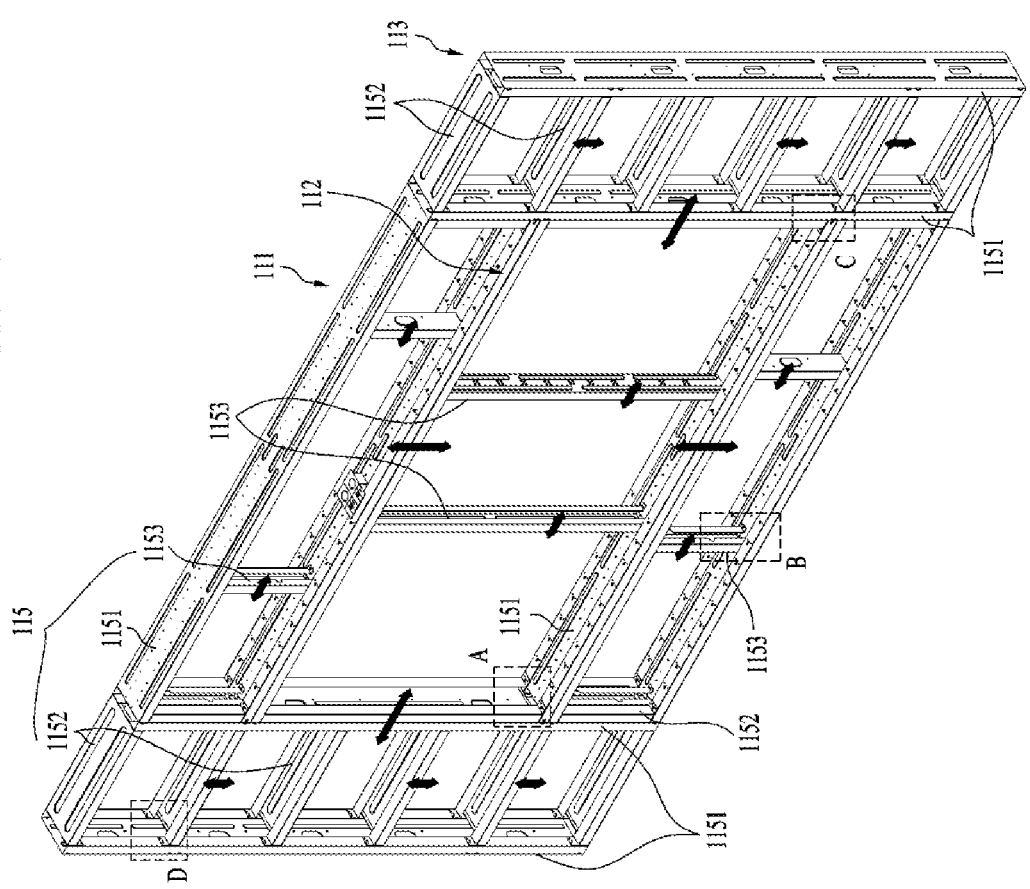
FIG. 6 is a view illustrating a frame structure of a smart wall according to an embodiment of the present disclosure.

FIG. 6 is a view showing the frame structure 110 of the smart wall 100 according to an embodiment of the present disclosure. A shape in which the pair of first frame modules 111, the pair of second frame modules 112, and the third frame module 113 shown in FIG. 3 are coupled to each other. Even the frame modules 111, 112, and 113 are installed in a pre-assembled state, partial modifications may be necessary depending on a size of the electronic appliance 160 to be mounted or a structure of a house. Therefore, the shape steel may be fastened using a fastener such as a screw for easy assembly and separation rather than using a welding scheme.

In addition, rather than manufacturing the shape steel 115 differently depending on a size of the frame module or a type of the frame module, a shape steel 115 that may be easily assembled by adjusting only a length thereof is required. All of the first to third frame modules 111, 112, and 113 may be implemented with only the first shape steel 1151 disposed in the longitudinal direction and the second shape steel 1152 disposed between the pair of first shape steels 1151. However, because sizes of the respective frame modules are different, each of the first shape steel 1151 and the second shape steel 1152 may be used by being cut to have a required length. A first fastening portion 1156 of the first shape steel 1151 and a second fastening portion 1157 of the second shape steel 1152 may be coupled to each other to form the first to third frame modules 111, 112, and 113 of a quadrangle as shown in FIG. 3.

Figure 7:
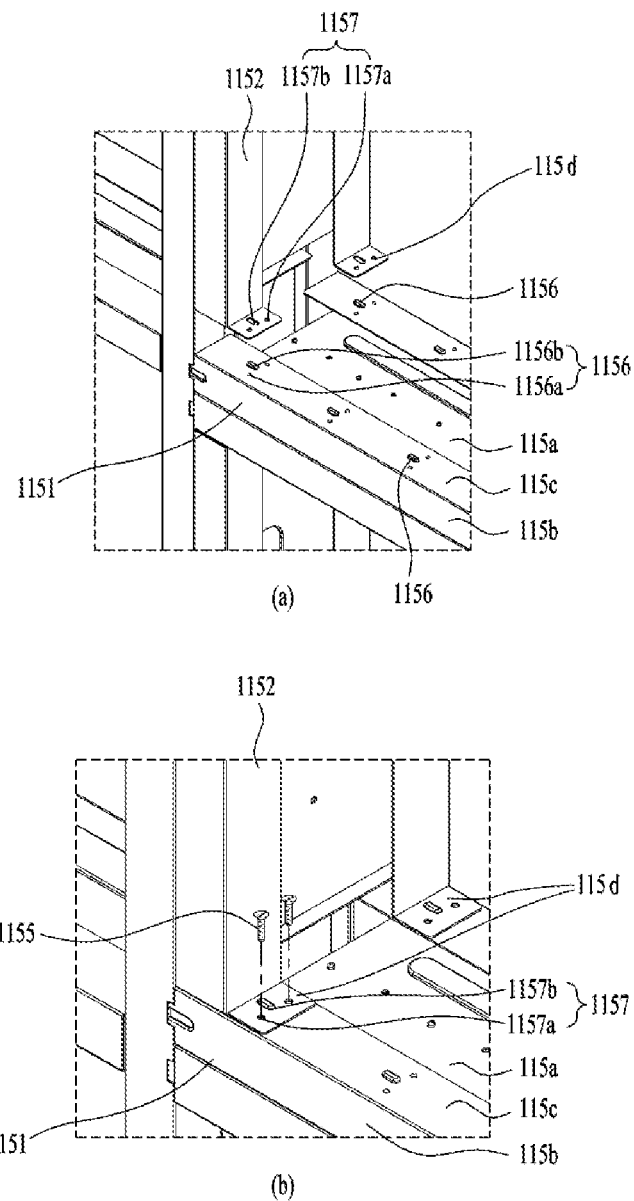
FIG. 7 is a view showing a portion A of FIG. 6.

FIG. 7 is a view showing a portion A of FIG. 6, and is a view showing fastening of the first shape steel 1151 and the second shape steel 1152 of the third frame. The first frame is the same as the third frame in that, although the second shape steel 1152 is shorter than that of the third frame, the first shape steel 1151 is horizontally disposed and the second shape steel 1152 is vertically disposed.

Referring to (a) in FIG. 7, the first fastening portion 1156 formed in the first shape steel 1151 may include a first fastening hole 1156a and a first guide 1156b. For stable coupling, a plurality of first fastening holes 1156a may be arranged in the width direction of first shape steel 1151. To form a stable frame structure, widths of the first shape steel 1151 and the second shape steel 1152 may be the same. In this case, the second shape steel 1152 is placed on the edges 115c of the first shape steel 1151, so that the first fastening portion 1156 may be formed in each edge 115c of the first shape steel 1151.

Because the edges 115c are located on both sides symmetrically in the width direction, a pair of first fastening portions 1156 may be disposed in the width direction. The first shape steel 1151 may include a plurality of first fastening portions 1156 spaced apart from each other in the longitudinal direction such that a position where the second shape steel 1152 is coupled to the first shape steel 1151 may be freely changed.

The second fastening portion 1157 formed in the second shape steel 1152 may be formed in a wing portion 115d extending by being bent 90° from an end of the edge 115c of the second shape steel 1152 as shown in (a) in FIG. 7. As shown in (b) in FIG. 7, the second fastening portion 1157 may be overlapped with the first fastening portion 1156, and the first shape steel 1151 and the second shape steel 1152 may be assembled with each other using a screw 1155 penetrating the first fastening hole 1156a of the first fastening portion 1156 and the second fastening hole 1157a of the second fastening portion 1157.

In order to assemble the first shape steel 1151 and the second shape steel 1152 using the screw 1155 penetrating the first fastening hole 1156a and the second fastening hole 1157a, it is necessary to precisely position the first shape steel 1151 and the second shape steel 1152. The first guide 1156b and the second guide 1157b may be further included to align the first fastening hole 1156a and the second fastening hole 1157a. As shown in (a) of FIG. 7, the first guide 1156b may be formed in a shape of a protrusion positioned between the first fastening holes 1156a, and the second guide 1157b formed in the second shape steel 1152 may be defined as a hole corresponding to the first guide 1156b. Conversely, the second guide 1157b may have a protruding shape, and the first guide 1156b may have a hole shape.

Because the first guide 1156b and the second guide 1157b are formed to match the positions of the first fastening hole 1156a and the second fastening hole 1157a, the first guide 1156b and the second guide 1157b may be respectively disposed adjacent to the first fastening hole 1156a and the second fastening hole 1157a. As shown in (a) in FIG. 7, the first guide 1156b may be formed between a pair of first fastening holes 1156a arranged in the width direction, and the second guide 1157b may be defined between the second fastening holes 1157a.

FIG. 8 is a view showing portions B and C of FIG. 6. (a) in FIG. 8 is a view showing the fastening portions 1156 and 1157 of the first shape steel 1151 and the second shape steel 1152 of the third frame module 113. The third frame module 113 vertically extended is different from the first frame module 111 in that the first shape steel 1151 is disposed in the vertical direction and the second shape steel 1152 is disposed in the horizontal direction, but is the same as the first frame module 111 described above in terms of a fastening scheme.

As shown in FIG. 6, the third frame module 113 may partition the mounting cell by arranging the plurality of second shape steels 1152 in a middle thereof. The mounting cell of the third frame module 113 is vertically disposed, so that the second shape steel 1152 located in the middle of the third frame module 113 may have the same size as those located at both ends of the third frame module 113 to support a weight of the electronic appliance 160.

(b) in FIG. 8 is a view showing fastening portions of the first shape steel 1151 and the third shape steel 1153. Because the first frame module 111 or the second frame module 112 has a long shape in the horizontal direction, sagging may occur in the middle. To prevent this, the third shape steel 1153 placed between the pair of second shape steels 1152 may be further included. As a main function of the third shape steel 1153 is to prevent the sagging of the first shape steel 1151, the third shape steel 1153 may be formed thinner than the first shape steel 1151 or the second shape steel 1152.

In particular, when mounting the display device 161 having the large size like the second frame module 112, because the mounting cell is substantially partitioned when a thickness of the third shape steel 1153 is equal to that of the second shape steel 1152, the thin third shape steel 1153 may be used.

When a panel of the display device 161 is placed on an entire front surface of the display device 161 and parts such as a board are disposed on a rear surface of the display device 161 so as not to overlap with the third shape steel 1153, a large-area display device 161 may be mounted on the third frame module 113.

A width of the third shape steel 1153 may be smaller than that of the first shape steel 1151. As shown in (b) in FIG. 8, the third shape steel 1153 may be inserted between the edges 115c of the first shape steel 1151. In order to fasten the third shape steel 1153 to the first shape steel 1151, a third fastening portion 1158 positioned at an end of the third shape steel 1153 and a fourth fastening portion 1159 formed in the base 115a of the first shape steel 1151 may be further included.

A plurality of fourth fastening portions 1159 may be arranged in the longitudinal direction of the first shape steel 1151 like the first fastening portions 1156. Because the third fastening portion 1158 is coupled to the base 115a of the first shape steel 1151, unlike the second shape steel 1152, which is coupled to the edge 115c of the first shape steel 1151, the base 115a of the third shape steel 1153 comes into contact with the base 115a of the first shape steel 1151. Therefore, a third guide 1158b of the third fastening portion 1158 may be formed in the wing portion 115d connected to the base 115a of the third shape steel 1153. A fourth guide of the fourth fastening portion 1159 may be formed in the base 115a of the first shape steel 1151 at a position corresponding thereto.

Figure 9:
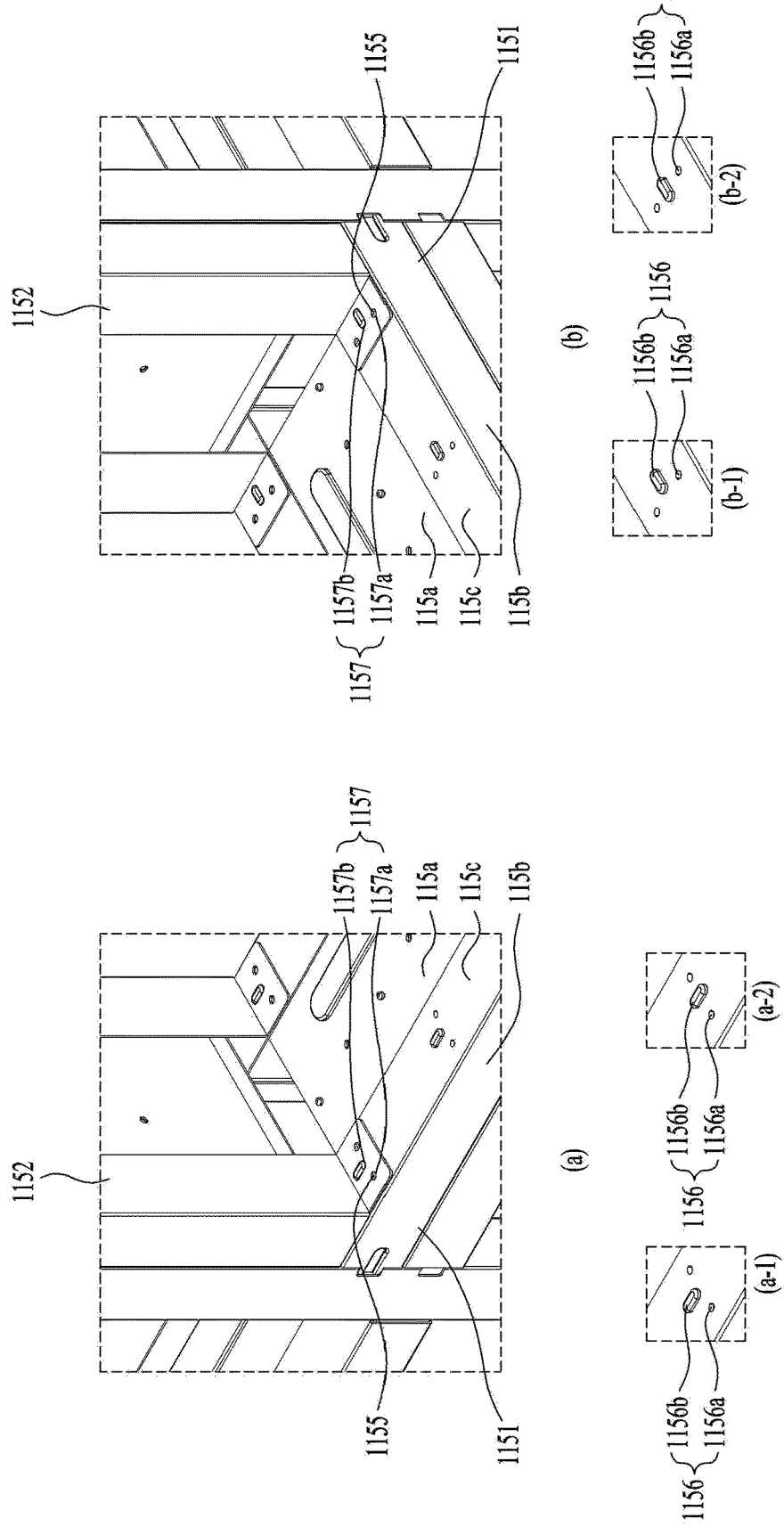
FIG. 9 is a view for illustrating a symmetrical structure of a shape steel of a smart wall 100 according to an embodiment of the present disclosure.

FIG. 9 is a view for illustrating a symmetrical structure of the shape steel 115 of the smart wall 100 according to an embodiment of the present disclosure. The second shape steel 1152 coupled to one side of the first shape steel 1151 as shown in (a) in FIG. 9 and the second shape steel 1152 coupled to the other side of the first shape steel 1151 as shown in (b) in FIG. 9 may be symmetrically disposed. The second shape steels 1152 may be arranged such that the respective edges 115c of the second shape steels 1152 face each other, and the bases 115a are outwardly directed.

The second fastening portion 1157 of the second shape steel 1152 should be able to be fastened with the first fastening portion 1156 of the first shape steel 1151 even when the second shape steels 1152 are symmetrically arranged. In order to solve the above problem, the first fastening portions 1156 may be formed symmetrical with respect to a middle of the first shape steel 1151. (a-1) in FIG. 9 is a view showing the first fastening portion 1156 located on one side of the first shape steel 1151, and (b-1) in FIG. 9 is a view showing the first fastening portion 1156 located on the other side of the first shape steel 1151. The first fastening portion 1156 (the first fastening hole 1156a and the first guide 1156b) located on one side of the first shape steel 1151 is symmetrical with the first fastening portion 1156 (the first fastening hole 1156a and the first guide 1156b) located on the other side of the first shape steel 1151.

Alternatively, the first fastening holes 1156a and the first guide 1156b of the first fastening portion 1156 may be in a point symmetry with respect to the first guide 1156b such that the second fastening portion 1157 of the second shape steel 1152 and the first fastening portion 1156 of the first shape steel 1151 coincide even when the second shape steels 1152 are reversely coupled as shown in (a-2) and (b-2) in FIG. 9. That is, the first guide 1156b may be located in the middle of the first fastening holes 1156a, and a longitudinal center of the first guide 1156b may be positioned on the same line as the pair of first fastening holes 1156a, so that the second shape steel 1152 may be coupled by being rotated 180°.

Through such fastening structure, various frame structures 110 may be formed using only the first shape steel 1151 and the second shape steel 1152 of the two types. When necessary, the third shape steel 1153 may be additionally disposed.

As is apparent from the above description, the smart wall 100 may be installed on a wall at the same height as a multimedia device such as a TV or an audio device mounted thereon, and may therefore provide a tidy appearance.

Without a need for manufacturing various types of shape steels 115, the fastening portions of the first shape steel 1151 and the second shape steel 1152 may be standardized and the various frame structures 100 may be implemented through length adjustment and fastening position varying, thereby reducing a manufacturing cost.

A size of the smart wall 100 may vary depending on an installation location, so that the smart wall 100 is customizable. In particular, it is easy to adjust the position of each shape steel 115 of the frame module, so that a size of the mounting cell may be adjusted based on a shape of the electronic part.

The smart wall may be modularized, thereby facilitating mounting of any appliance. When a repair is needed, only a module may be easily removed. Thus, installation and maintenance are simple. Additionally, when a multimedia device or an appliance is added, the smart wall may be easily extended by adding a unit.

Further, it is not necessary to move away unused seasonal appliances into a separate mounting cell 114, which is advantageous in terms of securing space. The above embodiments should be construed in all aspects as illustrative and not restrictive. The scope of the disclosure should be determined by the appended claims and their legal equivalents, and all changes coming within the meaning and equivalency range of the appended claims are intended to be embraced therein.

The invention claimed is:
1. A smart wall comprising:
 a frame structure having a mounting cell defined therein, a first shape steel, and a second shape steel disposed in a direction perpendicular to the first shape steel;
 an electronic appliance disposed in the mounting cell; and
 an art wall for covering a front surface of the frame structure,
 wherein the first shape steel and the second shape steel have a same width,
 wherein each of the first shape steel and the second shape steel includes:
  a base;

a pair of side walls extending in a direction perpendicular to the base at both ends in the width direction of the base; and a pair of edges respectively extending in a direction parallel to the base from respective ends of the pair of side walls, wherein the second shape steel includes a pair of wing portions bent in a direction perpendicular to the pair of edges at an end in a longitudinal direction of the pair of edges, and wherein the frame structure includes:

a pair of first fastening portions positioned in the pair of edges of the first shape steel, and including a plurality of first fastening holes defined in a width direction of the first shape steel;

a pair of second fastening portions positioned at the pair of wing portions of the second shape steel and including a plurality of second fastening holes respectively corresponding to the plurality of first fastening holes; and a pair of fastening screws passing through the pair of first fastening portions and the pair of second fastening portions.

2. The smart wall of claim 1, wherein the pair of first fastening portions includes a first guide, and wherein the pair of second fastening portions includes a second guide fastened to the first guide.

3. The smart wall of claim 2, wherein the first guide is disposed between the plurality of first fastening holes defined in the width direction, and wherein the second guide is disposed between the plurality of second fastening holes defined in the width direction.

4. The smart wall of claim 1, further comprising an outlet inserted into a portion between respective ends of the pair of edges.

5. The smart wall of claim 1, wherein the first shape steel and the second shape steel each include a plurality of vent holes defined therein.

6. The smart wall of claim 1, wherein a length of the first shape steel is greater than a length of the second shape steel.

7. The smart wall of claim 1, wherein the pair of first fastening portions includes a plurality of first fastening portions spaced apart from each other by a predetermined distance in an extending direction of the first shape steel.

8. The smart wall of claim 7, wherein the plurality of first fastening portions are symmetrical with respect to a center in a longitudinal direction of the first shape steel.

9. The smart wall of claim 1, wherein the first shape steel includes a pair of first shape steels and the second shape steel includes a pair of second shape steels, and wherein the pair of first shape steels and the pair of second shape steels form a frame module.

10. The smart wall of claim 9, wherein the frame module includes a first frame module having the pair of first shape steels disposed in a horizontal direction, and wherein the first frame module is disposed between the pair of second shape steels and further includes a third shape steel having a width smaller than a width of each of the second shape steels.

11. The smart wall of claim 10, wherein each of the pair of first shape steels and the pair of second shape steels includes:

a base;

a pair of side walls extending in a direction perpendicular to the base at both ends in the width direction of the base; and a pair of edges respectively extending in a direction parallel to the base from respective ends of the pair of side walls, and wherein the third shape steel is inserted into a portion between the pair of edges of each of the first shape steels.

12. The smart wall of claim 10, wherein the frame module further includes a second frame module having a length the same as the pair of first shape steels of the first frame module and greater than a length of the pair of second shape steels of the first frame module, and wherein the first frame module and the second frame module are stacked in a vertical direction.

* * * * *